April 29, 1958 L. E. TANK 2,832,935

PRINTED CIRCUIT DELAY LINE

Filed June 9, 1954

INVENTOR.
LAWRENCE E. TANK

BY Thomas V. Holden

United States Patent Office 2,832,935 Patented Apr. 29, 1958

2,832,935

PRINTED CIRCUIT DELAY LINE

Lawrence E. Tank, Baltimore, Md., assignor to Aircraft Armaments, Inc., Baltimore, Md., a corporation of Maryland Application June 9, 1954, Serial No. 435,587

6 Claims. (Cl. 333—29)

This invention relates to delay lines, and particularly to a delay line combining good band width and temperature characteristics with small size and simple and economical construction.

While many forms of delay lines, both of the lumped constant and distributed constant types are known and have been used, because of the physical conformities of the components of such known types and the need to avoid discontinuities caused when such lines are folded, delay lines designed to give a high total time delay and wide band characteristics become elongated and space consuming in form and do not lend themselves well to the spatial limitations present in most types of electronic devices. In addition, in order to provide the necessary inductance and capacitance characteristics to form a time delay network, various combinations of cores and inductive windings and networks of inductive and capacitive circuit elements have been used, none of which lend themselves readily to the fabrication of a compact and rugged delay device, or to economical and convenient manufacturing techniques.

This invention discloses a method of utilizing printed circuit techniques to form a rugged and compact delay line, by using discs of dielectric material imprinted or coated with conductive material by conventional methods, so that a network combining the characteristics of both lumped constant and distributed constant delay lines may be formed by stacking such discs alternately with insulator discs in a manner to be hereinafter more fully described.

It is an object of this invention, therefore, to provide a method of utilizing printed circuits to form a delay line providing a wide band characteristic in conjunction with small size and convenient form.

It is another object of this invention to provide a printed circuit delay line for rugged and compact configuration having good temperature characteristics.

It is a further object of this invention to provide a delay line of simple and economical design which may be readily and conveniently manufactured.

Further objects and advantages will become apparent from the following description and claims taken in conjunction with the accompanying drawings.

Figure 1:
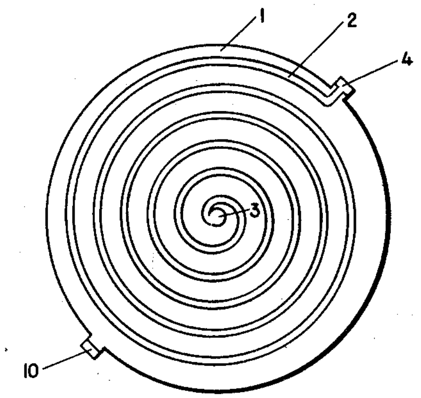
Fig. 1 is a view of the inductive side of one of the discs forming the delay line.

Referring to Fig. 1, a typical disc 1 is seen to carry a printed conductor 2 formed into a spiral beginning at the center contact 3 and extending outward to a tab 4, this side of the disc being hereinafter referred to as the inductive side. It should be understood that although a spiral is an effective form for producing inductive reactance in a printed circuit, other configurations are effective for the purpose, and any configuration which will produce the desired effect may be used. Methods of making so-called printed circuits by imprinting or coating insulating materials with a conductor are well known, but any method of applying a conductor to an insulator in this fashion is suitable for use with the present invention.

Figure 2:
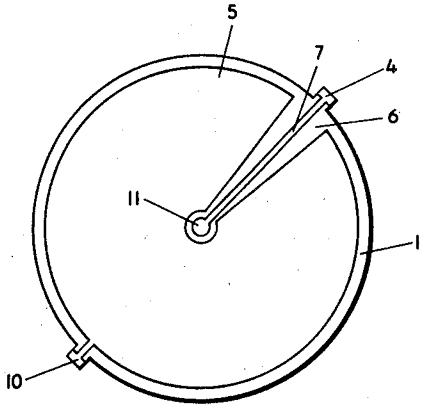
Fig. 2 is a view of the opposite or capacitive side of the disc.
Figure 3:
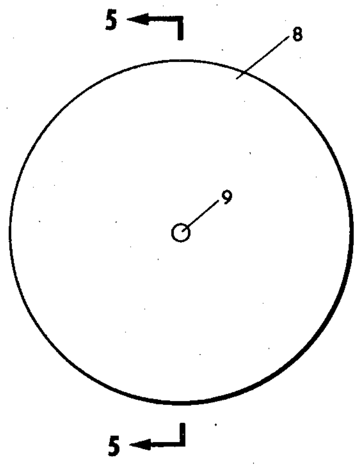
Fig. 3 is a view of an insulating or separating disc.
Figure 5:
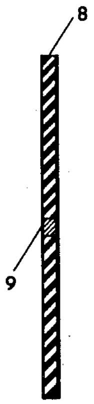
Fig. 5 is a sectional view taken on line 5—5 of Fig. 3.

The opposite side of the disc 1, as shown in Fig. 2, is coated over a large portion of its surface with a conductor 5, an uncoated portion of the disc 1 forming a strip 6 extending from the center to the edge of the disc, and forming a path for a second conductor 7 which extends from the center contact 11 to the tab 4 through the center of the strip 6. The size and shape of the conductive area so formed may be varied to give the desired electrical characteristics for forming the delay line. This side of disc 1 will be hereinafter referred to as the capacitive side. The tab 4 is also conductively coated so that conductor 7 connects with the outer end of spiral conductor 2 on the opposite side of the disc. A second disc 8, shown in Fig. 3, is made of insulating material, and carries a core 9 of conductive material extending through its center.

Figure 4:
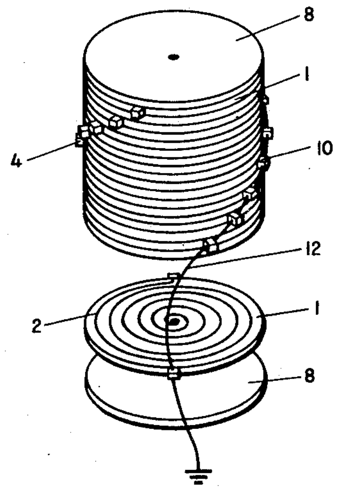
Fig. 4 is a perspective view of a delay line formed in accordance with the present invention showing the bottom two discs separated from the stack for clarity.

To form the delay line, the discs 1 and 8 are stacked alternately, as shown in Fig. 4, so that an insulator disc 8 lies between each of the discs 1, the center core 9 forming an electrical connection through the insulator disc between contact 3 on the inductive side of disc 1, and the contact 11 on the capacitive side of the next such disc in the stack. From the contact 11 the radial conductor 7 extends outward to the conductively coated tab 4. Thus, the spiral conductors 2 form a series connected group of inductive elements.

The tabs 10, as shown in Fig. 4, are connected together with a ground wire 12 forming a common connection between the conductive areas 5, so that the capacitance between the capacitive side of each disc 1 and its inductive side constitutes a distributed capacitance to give the network formed by the assembled stack of discs the characteristics of a distributed constant line.

The tabs 4 which connect with the outer ends of the spiral conductor 2 constitute a series of taps along the delay line so that any desired incremental value of delay may be picked off of the line by connecting the output to the proper tap. The entire stack may be clamped or fastened together by any suitable means, or may be glued together or invested in a plastic or other suitable material to form a sturdy compact unit.

Obviously, a delay line of any desired value of time delay and band width may be made by properly choosing inductive and capacitive values for the elements of the line and stacking together the required number of discs in the manner hereinbefore described. Since the discs may be made very thin, it is possible to assemble very short stacks which will have extremely high total time delay and wide band width characteristics.

In addition, this type of construction is very sturdy and rugged, providing a compact and durable delay line for use in electronic applications where such equipment is subjected to severe shock and vibration and reliable operation under such conditions is essential.

It is readily seen that this method of construction provides a simple and effective means for constructing a delay line of convenient size and shape which will have a wide pass band characteristic, and allows the use of conductive and dielectric materials having the most desirable characteristics for forming a ruggedly constructed line having good temperature characteristics.

While only one embodiment of this invention has been shown and described, it is obvious that many changes and modifications may be made without departing from the scope of the invention, and it is to be understood that the appended claims are intended to cover all such changes and modifications as fall within the true spirit and scope of this invention.

I claim:

1. A delay line comprising a plurality of substantially flat dielectric plates, each said plate bearing on one side thereof a conductive element conformed to give an inductive reactance, each said plate bearing on the other side thereof a conductive area and an electrical contact separate therefrom, conductive means connecting said contact with one end of said conducting element, a second dielectric plate interposed between each of the first said dielectric plates, each said second dielectric plate bearing a conductor extending therethrough to connect each said contact to the remaining end of the conductive element on the next adjacent one of the first said dielectric plates, whereby to connect said conductive elements in series, and conductive means for making a common connection to each said conductive area.

2. A delay line comprising a stack of dielectric plates, each said plate bearing on one side thereof a strip of conductive material conformed to give an inductive reactance, each said plate bearing on the other side thereof an area coated with conductive material and an electrical contact separate therefrom, conductive means connecting said contact with one end of said strip, a second dielectric plate interposed between each of the first said dielectric plates, conductive means extending through each of said second dielectric plates to connect each said contact with the remaining end of the strip on the next adjacent one of the first said dielectric plates, whereby to connect said conductive strips in series, and conductive means making a common electrical connection to each said area coated with conductive material.

3. A delay line comprising a plurality of dielectric plates bearing on one side thereof a printed circuit element conformed to give an inductive reactance, each said plate bearing on the other side thereof a printed conductive area an electrical contact separate therefrom, conductive means connecting said contact with one end of said circuit element, a second plurality of dielectric plates interposed between each of the first said plurality of plates, each of said second plurality of plates having a central conductive core extending therethrough to connect each said contact with the remaining end of the circuit element on the next adjacent one of the first said dielectric plates, whereby to connect said printed circuit elements together in series, and a common electrical connection to each said conductive area.

4. A dielectric plate bearing on one side thereof a printed circuit element comprising spirally shaped conductor, means forming an electrical contact at the center of said spiral conductor, means forming a second electrical contact on the other side of said plate opposite the first said contact, conductive means connecting said second contact means to the outer end of said spiral conductor, means forming a conductive area on said opposite side of said plate, and means for making electrical connection to said spiral conductor and to said conductive area.

5. A delay line comprising a plurality of dielectric plates, each said plate bearing on one side thereof a spirally shaped conductor, means forming a first electrical contact at the center of each of said spiral conductors, means forming a second electrical contact on the opposite side of each of said plates, conductive means connecting each said second contact means to the outer end of each said spiral conductor, means forming a conductive area on said opposite side of each of said plates, means forming a common electrical connection to each said conductive area, said plates being arranged to form a stack, conductive means disposed between each of said plates to connect each said first electrical contact with said second electrical contact on the next adjacent plate, whereby to connect said spiral conductors in series, and means for making an electrical connection to said spiral conductors.

6. A delay line comprising a plurality of dielectric plates, each said plate bearing on one side thereof a spirally shaped conductor, means forming an electrical contact at the center of each of said spiral conductors, means forming a second electrical contact on the opposite side of each of said plates, conductive means connecting each said second contact means to the outer end of each said spiral conductor, means forming a conductive area on said opposite side of each of said plates, means carried at the edge of said plate and connected with the outer end of said spiral conductor for making electrical connection thereto, means forming a common electrical connection to each said conductive area, an insulating plate disposed between each of said dielectric plates, each said insulating plate having a conductor extending therethrough and connecting the first said contact on one side of one of said plates with the second said contact on the opposite side of the next adjacent one of said plates.

References Cited in the file of this patent

UNITED STATES PATENTS

| | | |
|---|---|---|
| 2,014,524 | Franz | Sept. 17, 1935 |
| 2,066,511 | Arlt | Jan. 5, 1937 |
| 2,305,357 | Paluev | Dec. 15, 1942 |
| 2,462,410 | Lindenblad | Feb. 22, 1949 |
| 2,512,945 | Kallman | June 27, 1950 |
| 2,583,854 | Kehbel | Jan. 29, 1952 |
| 2,586,854 | Myers | Feb. 26, 1952 |
| 2,629,827 | Eckert | Feb. 24, 1953 |
| 2,768,357 | Lyons | Oct. 23, 1956 |

FOREIGN PATENTS

| | | |
|---|---|---|
| 632,834 | Great Britain | Dec. 5, 1949 |